United States Patent
Marzaki et al.

(10) Patent No.: US 11,626,365 B2
(45) Date of Patent: Apr. 11, 2023

(54) CO-INTEGRATED VERTICALLY STRUCTURED CAPACITIVE ELEMENT AND FABRICATION PROCESS

(71) Applicants: STMicroelectronics (Rousset) SAS, Rousset (FR); STMicroelectronics (Crolles 2) SAS, Crolles (FR)

(72) Inventors: Abderrezak Marzaki, Aix en Provence (FR); Arnaud Regnier, Les Tallades (FR); Stephan Niel, Meylan (FR)

(73) Assignees: STMicroelectronics (Rousset) SAS, Rousset (FR); STMicroelectronics (Crolles 2) SAS, Crolles (FR)

( * ) Notice: Subject to any disclaimer, the term of this patent is extended or adjusted under 35 U.S.C. 154(b) by 188 days.

(21) Appl. No.: 17/226,324

(22) Filed: Apr. 9, 2021

(65) Prior Publication Data
US 2021/0225757 A1 Jul. 22, 2021

Related U.S. Application Data

(62) Division of application No. 16/546,569, filed on Aug. 21, 2019, now Pat. No. 11,004,785.

(51) Int. Cl.
*H01L 23/522* (2006.01)
*H01L 49/02* (2006.01)
*H01L 27/11524* (2017.01)

(52) U.S. Cl.
CPC .... *H01L 23/5223* (2013.01); *H01L 27/11524* (2013.01); *H01L 28/91* (2013.01); *H01L 28/92* (2013.01)

(58) Field of Classification Search
CPC ......... H01L 27/10876; H01L 27/11524; H01L 23/5223; H01L 28/91; H01L 28/92
See application file for complete search history.

(56) References Cited

U.S. PATENT DOCUMENTS 5,581,110 A 12/1996 Razouk et al.
5,805,494 A 9/1998 El-Kareh et al.
(Continued)

FOREIGN PATENT DOCUMENTS

EP 1335425 A1 8/2003
FR 2894708 A1 6/2007
(Continued)

OTHER PUBLICATIONS

La Rosa, F., et al.: "40nm Embedded Select in Trench Memory (eSTM) Technology Overview," 2019 IEEE 11th International Memory Workshop, 4 pages.

*Primary Examiner* — Jaehwan Oh
*Assistant Examiner* — John M Parker
(74) *Attorney, Agent, or Firm* — Crowe & Dunlevy

(57) ABSTRACT

First and second wells are formed in a semiconductor substrate. First and second trenches in the first second wells, respectively, each extend vertically and include a central conductor insulated by a first insulating layer. A second insulating layer is formed on a top surface of the semiconductor substrate. The second insulating layer is selectively thinned over the second trench. A polysilicon layer is deposited on the second insulating layer and then lithographically patterned to form: a first polysilicon portion over the first well that is electrically connected to the central conductor of the first trench to form a first capacitor plate, a second capacitor plate formed by the first well; and a second polysilicon portion over the second well forming a floating gate electrode of a floating gate transistor of a memory cell having an access transistor whose control gate is formed by the central conductor of the second trench.

21 Claims, 8 Drawing Sheets

(56) References Cited

U.S. PATENT DOCUMENTS

| | | | |
|---|---|---|---|
| 6,391,707 B1 | 5/2002 | Dirnecker et al. | |
| 7,449,744 B1 | 11/2008 | Yu et al. | |
| 8,085,524 B2 | 12/2011 | Roozeboom et al. | |
| 8,492,820 B2 | 7/2013 | Anderson et al. | |
| 8,525,245 B2 | 9/2013 | Erickson et al. | |
| 8,816,470 B2 | 8/2014 | Erickson et al. | |
| 9,159,723 B2 | 10/2015 | Chou et al. | |
| 9,178,080 B2 | 11/2015 | Kalnitsky et al. | |
| 9,349,793 B2 | 5/2016 | Jaffe et al. | |
| 9,978,829 B2 | 5/2018 | Lin | |
| 10,049,890 B2 | 8/2018 | Chou et al. | |
| 10,084,035 B2 | 9/2018 | Papavasiliou et al. | |
| 10,109,601 B2 | 10/2018 | Marzaki | |
| 2007/0054461 A1 | 3/2007 | Su | |
| 2007/0278612 A1 | 12/2007 | Williams et al. | |
| 2009/0039466 A1 | 2/2009 | Sanada | |
| 2011/0018094 A1 | 1/2011 | Chapman et al. | |
| 2012/0032260 A1 | 2/2012 | Hirler et al. | |
| 2013/0069198 A1 | 3/2013 | Claeys et al. | |
| 2013/0161792 A1 | 6/2013 | Tran et al. | |
| 2014/0061780 A1 | 3/2014 | Son et al. | |
| 2014/0145299 A1 | 5/2014 | Kalnitsky et al. | |
| 2014/0264523 A1 | 9/2014 | Loechelt et al. | |
| 2015/0061075 A1 | 3/2015 | Yeh | |
| 2015/0236031 A1 | 8/2015 | Mantelli et al. | |
| 2015/0348964 A1* | 12/2015 | Chou | H01L 28/91 257/534 |
| 2016/0020267 A1 | 1/2016 | Lin | |
| 2016/0218071 A1 | 7/2016 | Nam et al. | |
| 2019/0035880 A1* | 1/2019 | Voiron | H01L 29/0657 |
| 2019/0074363 A1 | 3/2019 | Zhu | |

FOREIGN PATENT DOCUMENTS

| | | |
|---|---|---|
| FR | 3013148 A1 | 5/2015 |
| FR | 3021457 A1 | 11/2015 |

* cited by examiner

CO-INTEGRATED VERTICALLY STRUCTURED CAPACITIVE ELEMENT AND FABRICATION PROCESS

CROSS-REFERENCE TO RELATED APPLICATION

This application is a divisional from United States application for patent Ser. No. 16/546,569 filed Aug. 21, 2019, the disclosure of which is incorporated by reference.

TECHNICAL FIELD

Embodiments and implementations relate to integrated circuits and in particular to the process co-integration of a capacitive element (such as a vertically structured capacitive element) with a high voltage MOS transistor and a memory cell.

BACKGROUND

Capacitive elements, such as charge-storage capacitors, are generally bulky components in integrated-circuit architectures.

Moreover, integrated-circuit component fabricating process steps are generally many in number and expensive, and it is constraining to implement steps dedicated solely to the fabrication of a single element or of a single type of element.

Thus, it would be desirable to increase the capacitance per unit area of integrated-circuit capacitive-element architectures, and to implement their fabricating steps conjointly with the production of other components of the integrated circuit.

SUMMARY

In an embodiment, a method comprises: forming a first well and a second well in a semiconductor substrate; forming a first trench in the first well and a second trench in the second well, wherein each of the first and second trenches extends vertically and includes a central conductor insulated by a first insulating layer; forming a second insulating layer having a first thickness on a top surface of the semiconductor substrate; thinning the second insulating layer over the second trench to a second thickness that is less than the first thickness; depositing a first polysilicon layer on the second insulating layer; lithographically patterning the first polysilicon layer to form: a first polysilicon portion over the first well, said first polysilicon portion being electrically connected to the central conductor of the first trench to form a first plate of a capacitor, a second plate of the capacitor formed by the first well; and a second polysilicon portion over the second well, said second polysilicon portion forming a floating gate electrode of a floating gate transistor of a memory cell having an access transistor whose control gate is formed by the central conductor of the second trench.

In an embodiment, an integrated circuit comprises: a semiconductor substrate; a capacitor supported by the semiconductor substrate; and a memory cell supported by the semiconductor substrate. The capacitor comprises: a first well in the semiconductor substrate forming a first plate of the capacitor; a first trench extending vertically into the first well, said first trench including a first central conductor insulated from the first well by a first insulating layer; a second insulating layer on a top surface of the semiconductor substrate over said first well, said second insulating layer having a first thickness; and a first layer of conductive material on the second insulating layer, said first layer of conductive material electrically connected to the first central conductor, wherein the first layer of conductive material and first central conductor form a second plate of the capacitor. The memory cell comprises: a second well in the semiconductor substrate; a second trench extending vertically into the second well, said second trench including a second central conductor insulated from the second well by a third insulating layer, wherein the second central conductor forms a gate electrode of an access transistor of the memory cell; a fourth insulating layer on the top surface of the semiconductor substrate over said second well, said fourth insulating layer having a second thickness which is less than the first thickness; and a second layer of conductive material on the fourth insulating layer, wherein the second layer of conductive material forms a floating gate electrode of a floating gate transistor of the memory cell.

In an embodiment, a method comprises: forming a first well and a second well in a semiconductor substrate; forming a first trench extending vertically into said first well and a second trench extending vertically into said second well; forming an insulating cladding on sides and a bottom of said first and second trenches; forming a conductive material in a central section of said first and second trenches; forming a first insulating layer on a top side of the semiconductor substrate; selectively thinning the first insulating layer over the second well; forming a first conductive layer covering the first insulating layer; lithographically patterning the first conductive layer to form a first conductive portion over the first well and a second conductive portion over the second well; forming a second conductive layer covering the second insulating layer; lithographically patterning the second conductive layer and the second conductive portion to form a third conductive portion over the first well and form a control gate electrode and floating gate electrode over the second well for a floating gate transistor of a memory cell; wherein the central section in the second trench forms a control gate electrode for an access transistor of the memory cell; electrically coupling the central section in the first trench to the first conductive portion to form a first electrode of a capacitive element; and electrically coupling the first well and the third conductive portion to form a second electrode of the capacitive element.

BRIEF DESCRIPTION OF THE DRAWINGS

Other advantages and features of the invention will become apparent on examining the detailed description of completely non-limiting embodiments and implementations, and the appended drawings, in which.

DETAILED DESCRIPTION

Figure 1:
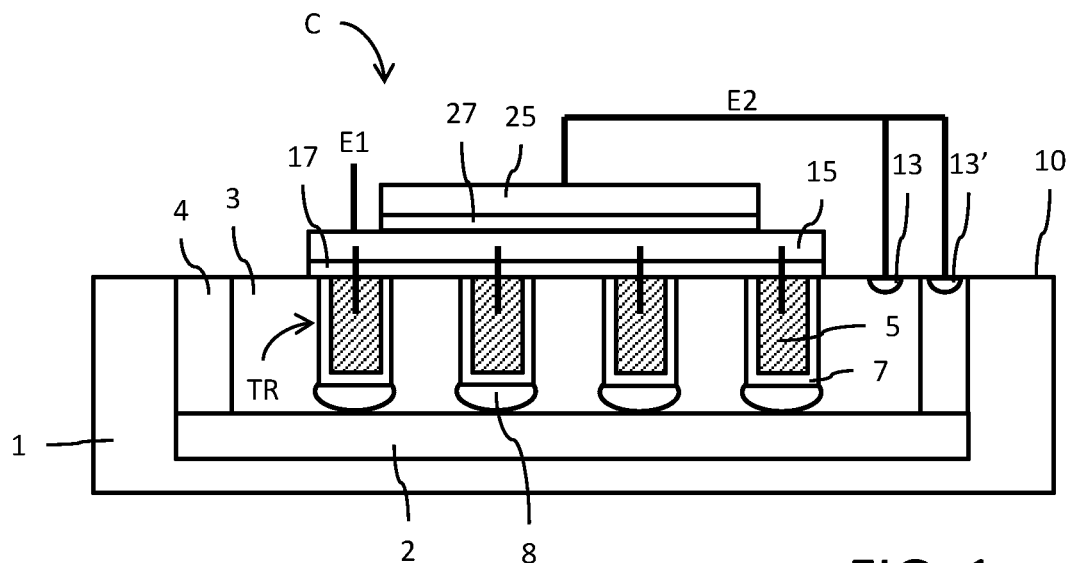
FIG. 1 schematically illustrates an embodiment of a capacitive element.

Reference is now made to FIG. 1 which schematically illustrates one embodiment of a capacitive element C. The capacitive element C is formed in and on a semiconductor substrate 1 doped with a first conductivity type (for example, p-type). A well 3 is vertically isolated from the substrate 1 by a buried layer 2 doped with a second conductivity type (for example, n-type, and referred to in the art as an NISO layer). The well 3 is laterally delimited and isolated from the substrate 1 by contact regions 4 that are also doped with the second conductivity type, where the contact regions extend from the front side 10 to the buried layer 2. This structure is of the well-known triple-well architecture technology. The well 3 further includes trenches TR that extend into the well from the front side 10. Each trench TR may include an implanted region 8 in the well 3 that is doped with the second conductivity type and located between the bottom of the trench and the buried layer 2. The trench TR is filled by a central section 5 made of a conductive material that is isolated from the well 3 by an insulating layer 7. For example, the central section 5 may be made of polycrystalline silicon (polysilicon) and the insulating layer 7 may be made of silicon oxide or another suitable dielectric material. On the front side 10, and above the well 3, a stack is formed comprising a first insulating layer 17, a first conductive layer 15, a second insulating layer 27 and a second conductive layer 25. The first and second conductive layers 15 and 25 may, for example, be made of doped polysilicon. The first insulating layer 17 may, for example, be made of a dielectric material such as silicon oxide. The second insulating layer 27 may, for example, be made of a silicon oxide-nitride-oxide (ONO) dielectric material.

A first electrode E1 of the capacitive element C is formed by the conductive central sections 5 of each trench TR and the first conductive layer 15 which is electrically connected to the conductive central sections 5 using vias and/or metal connection tracks. A second electrode E2 of the capacitive element C is formed by the second conductive layer 25 and the well 3 which is electrically connected to the second conductive layer 25 using vias and/or metal connection tracks.

Contact-redistribution regions 13 that are highly doped with the first conductivity type allow a contact of acceptable resistivity to be formed between the well 3 and, for example, contacts/metal connection tracks connected to the second conductive layer 25 for the second electrode E2. Contact-redistribution regions 13' that are highly doped with the second conductivity type allow a contact of acceptable resistivity to be formed between the contact regions 4 and, for example, contacts/metal connection tracks connected to the second conductive layer 25 for the second electrode E2.

The trenches TR extend longitudinally in a direction perpendicular to the cross-sectional plane shown in FIG. 1. With this extension, the trenches TR may extend past the extent of the first insulating layer 17 so as to permit the making of the electrical connection of the conductive central sections 5 of each trench TR to the first conductive layer 15.

Figure 2:
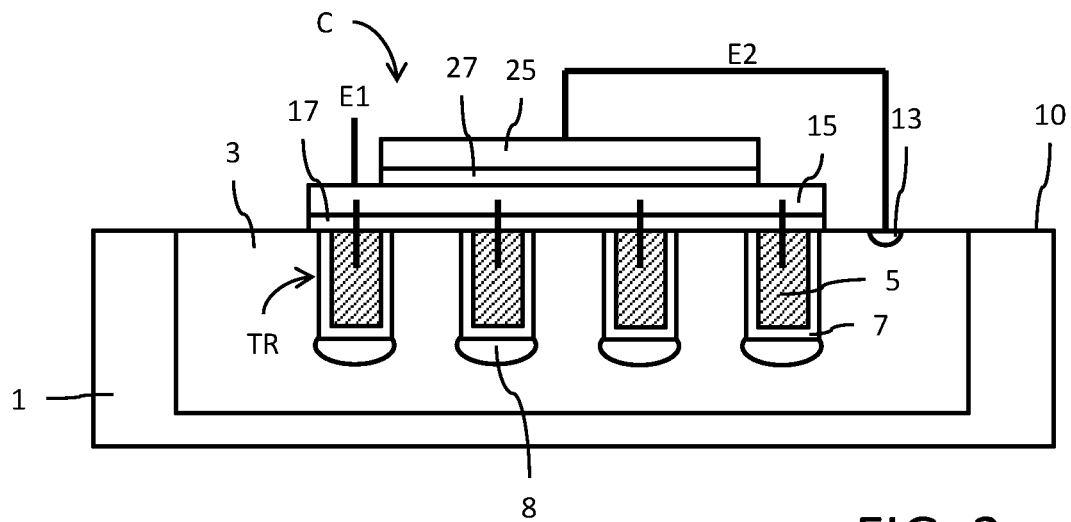
FIG. 2 schematically illustrates another embodiment of a capacitive element.

FIG. 2 shows an alternative embodiment that does not use triple-well architecture for delimiting the well 3. In accordance with one aspect of this implementation, the well 3 is a doped region of the first conductivity type formed within the substrate 1.

Figure 3A:
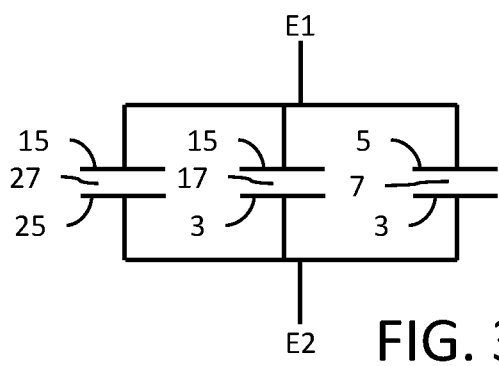
FIG. 3A shows an equivalent circuit diagram for the capacitive element of FIGS. 1 and 2.

FIG. 3 shows an equivalent circuit diagram for the capacitive element C.

The capacitive element C may be decomposed into an assembly of three capacitive elements in parallel.

A first capacitive element is formed by the first conductive layer 15 and the second conductive layer 25 mutually separated by the second insulating layer 27.

A second capacitive element is formed by the first conductive layer 15 and the well 3 mutually separated by the first insulating layer 17.

A third capacitive element is formed by the central sections 5 of the trenches TR and the well 3 mutually separated by the respective insulating liner 7 of the trenches TR.

The structures for the capacitive element C shown in FIGS. 1 and 2 are advantageously similar to a structure of a non-volatile memory cell. Specifically, such a memory cell may include an access transistor having a vertical gate with a structure homologous to the trenches TR, and a floating-gate transistor with a structure homologous to the stack of the first and second insulating layers 17, 27 and of the first and second conductive layers 15, 25. Still further, the stack of the first insulating layer 17 and the first conductive layer 15 for the capacitive element C shown in FIGS. 1 and 2 is advantageously similar to a structure of the insulated gate for a high voltage MOS transistor (for example, a transistor configured to support operation at higher voltage levels, such as voltages in the range from of about 4-5 voltage to about 8-10 volts). Because of these similarities, the same fabrication steps can be used in making both the capacitive element C, the memory cell and the high voltage MOS transistor on a common substrate 1.

Each memory cell includes a floating-gate transistor FGT produced in and on a semiconductor well 3 of the first conductivity type, in a triple-well architecture like that shown in FIG. 1 (i.e., the well 3 is separated from the subjacent substrate 1 of the first conductivity type by a buried semiconductor layer 2 and semiconductor segments 4 of the second conductivity type).

As is conventional, each floating-gate transistor FGT includes a source region S and a drain region D that are doped with the second conductivity type, and a floating gate electrode and a control gate electrode that are, for example, made of doped polysilicon and mutually separated by a control-gate dielectric (for example, made of ONO). The floating gate electrode rests on a tunnel-oxide layer formed on the surface of the well 3.

Each memory cell further includes an access transistor AT that allows a row of cells to be selected. This access transistor AT is a MOS transistor whose control gate is a vertical gate buried in the well 3 and electrically insulated from the well by a gate dielectric, typically made of silicon dioxide. The conductive control gate of the vertical gate is typically made, for example, of polysilicon.

An implanted region of the second conductivity type is located between the bottom of the trench accommodating the vertical gate and the buried layer 2 which allows, with the buried layer, the formation of the source region of the access transistor.

Figure 3B:
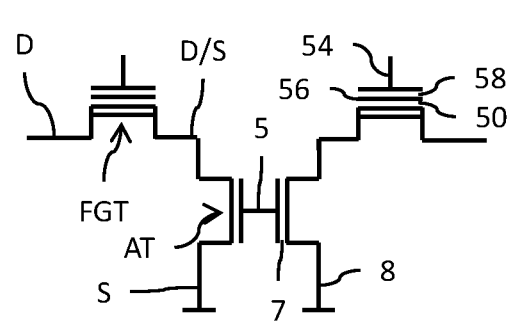
FIG. 3B shows an equivalent circuit diagram for a memory cell.
Figure 4A:
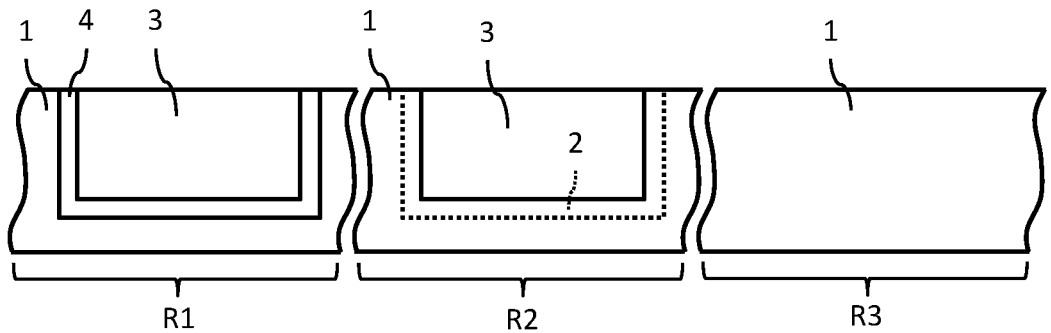
FIGS. 4A-4J illustrates steps of a fabrication process for co-integrating a capacitive element (of FIGS. 1-2), a memory cell and a high voltage MOS transistor on a common substrate.
Figure 4B:
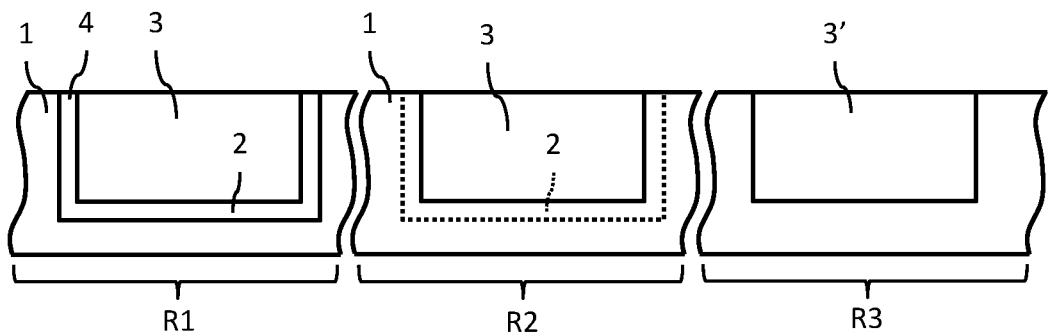
Figure 4C:
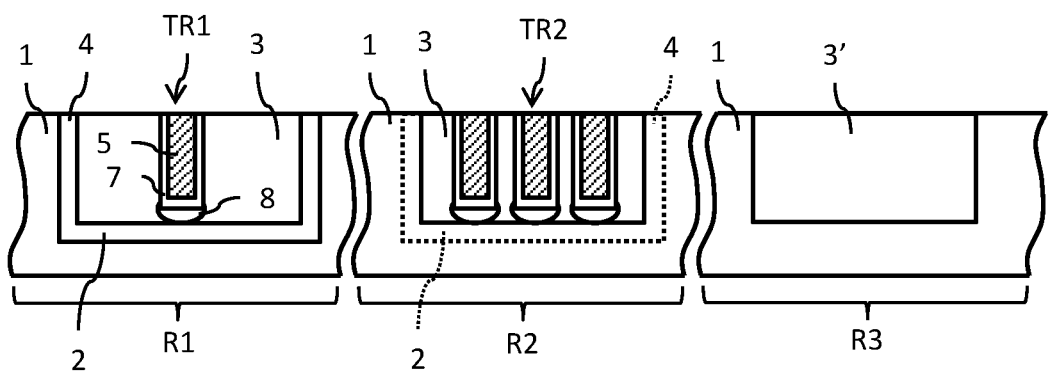
Figure 4D:
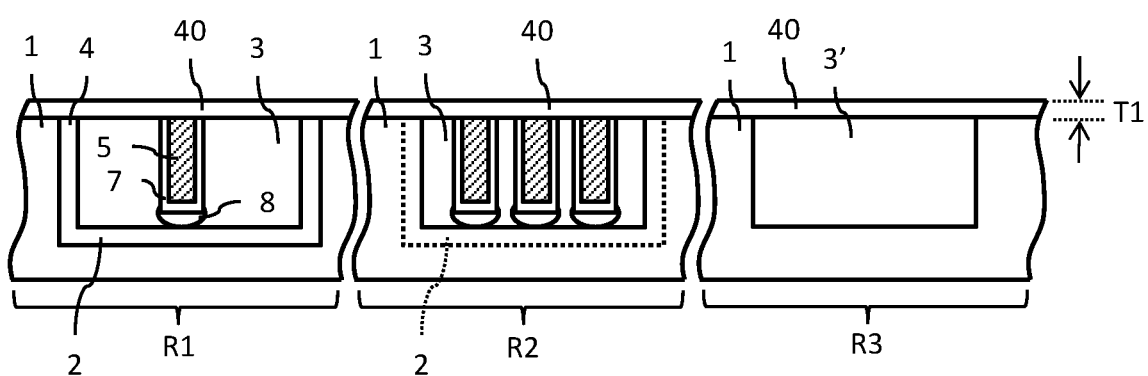
Figure 4E:
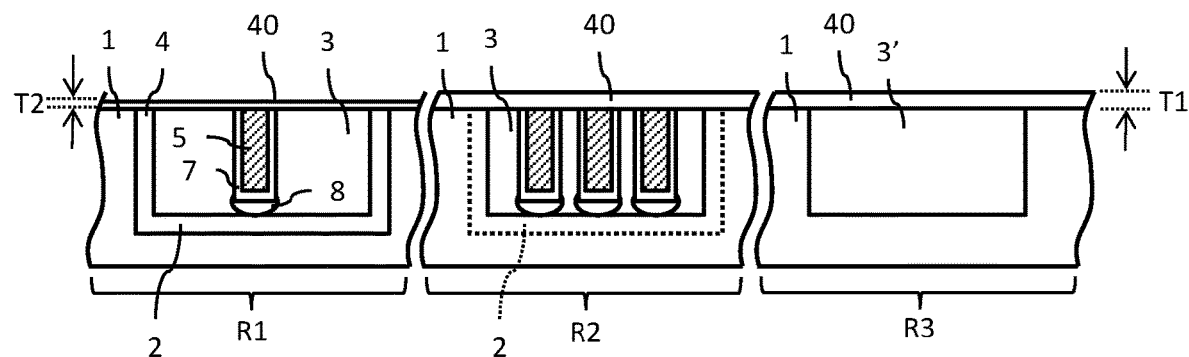
Figure 4F:
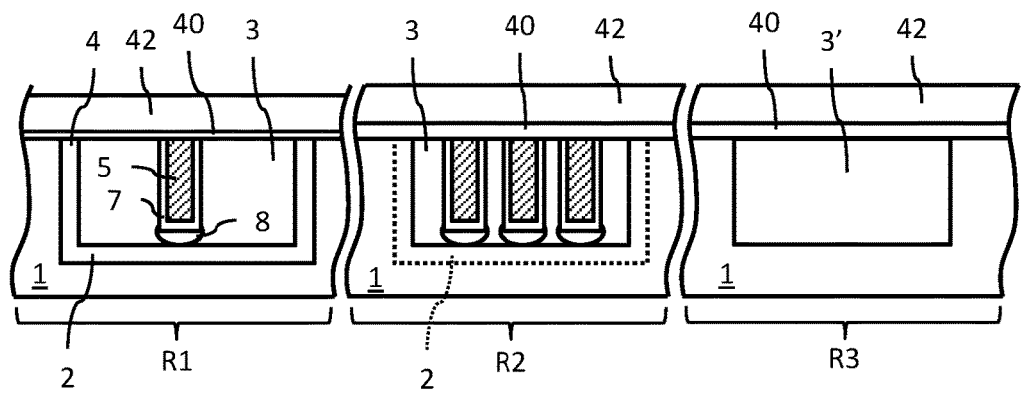
Figure 4G:
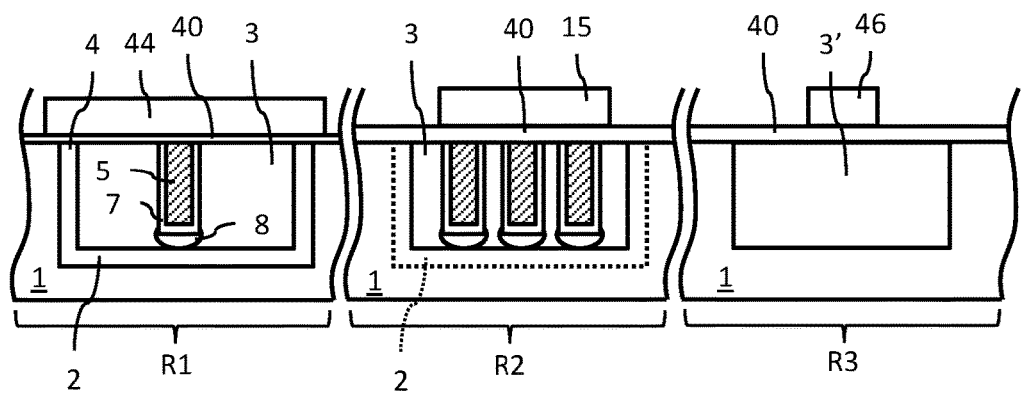
Figure 4H:
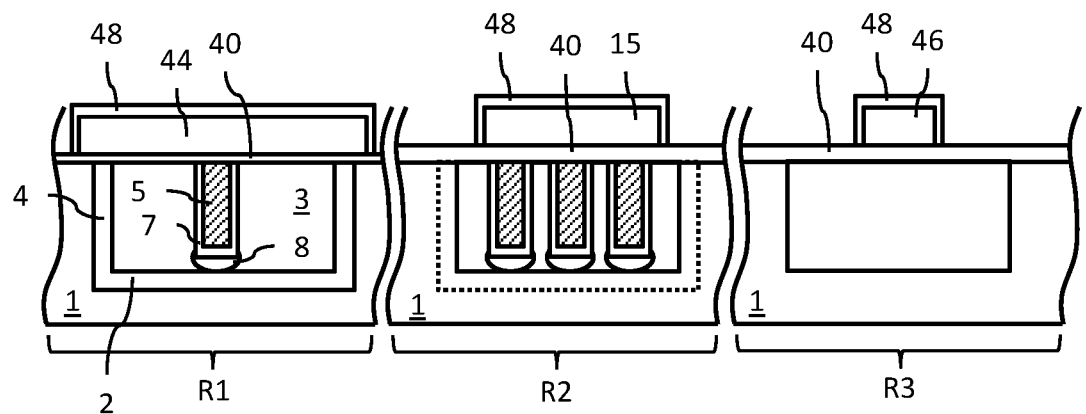
Figure 4I:
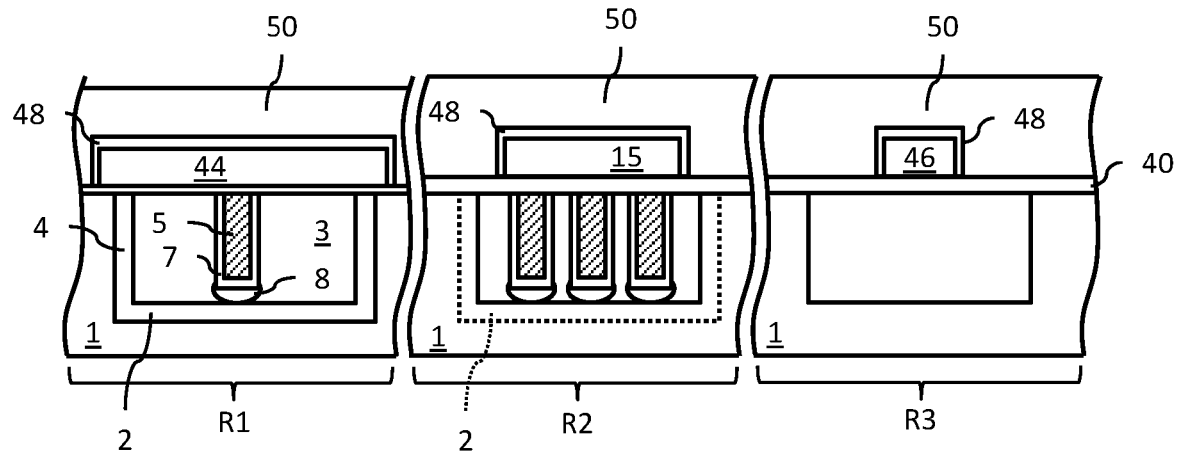
Figure 4J:
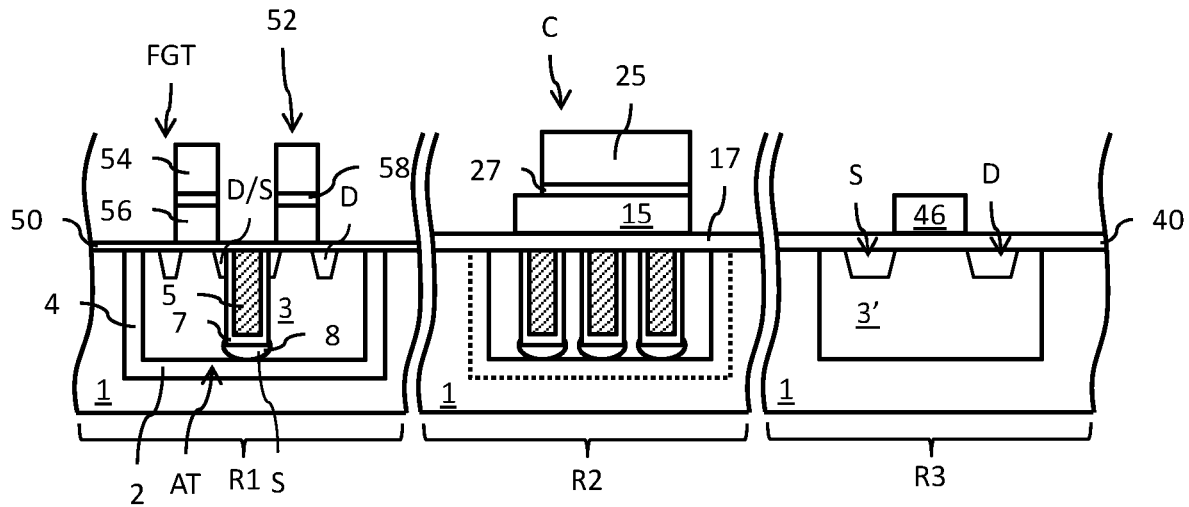
Figure 6B:
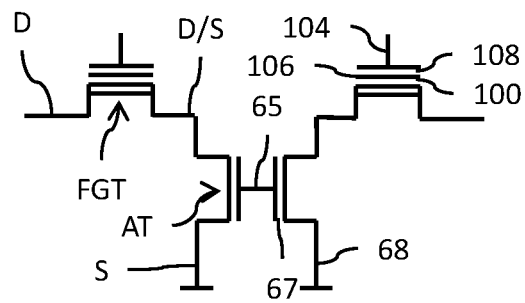
FIG. 6B shows an equivalent circuit diagram for a memory cell.
Figure 7A:
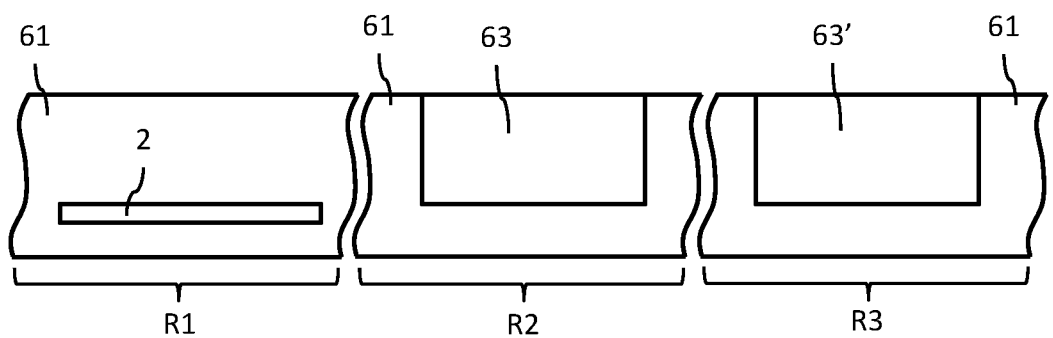
FIGS. 7A-7J illustrates steps of a fabrication process for co-integrating a capacitive element (of FIG. 5), a memory cell and a high voltage MOS transistor on a common substrate.
Figure 7B:
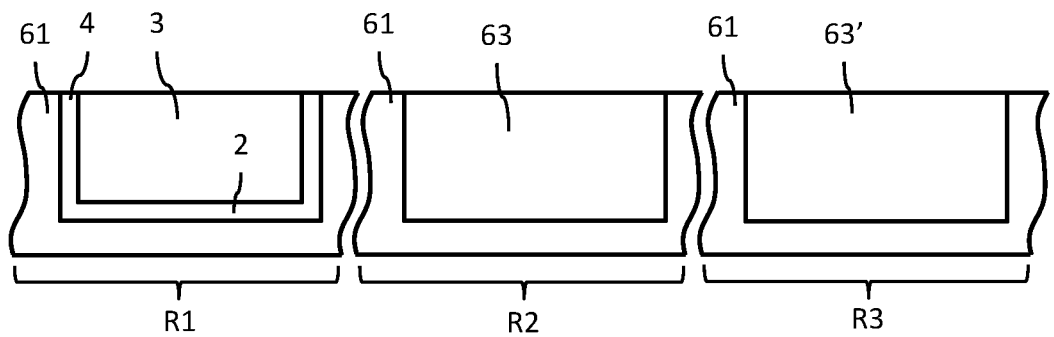
Figure 7C:
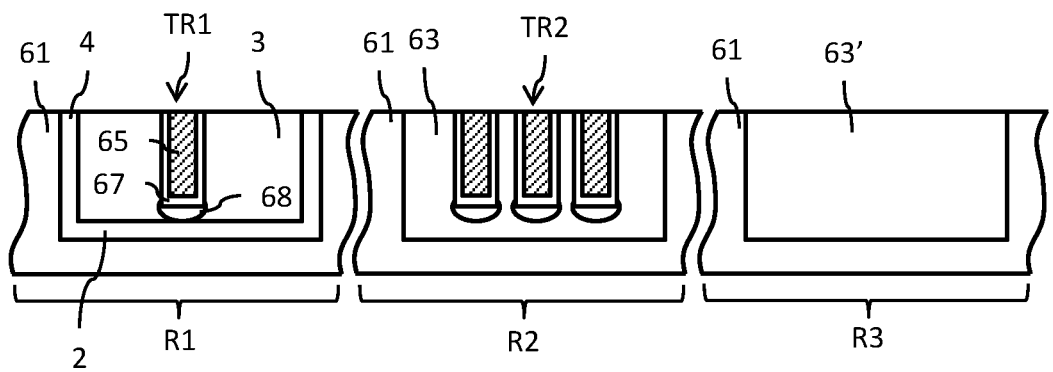
Figure 7D:
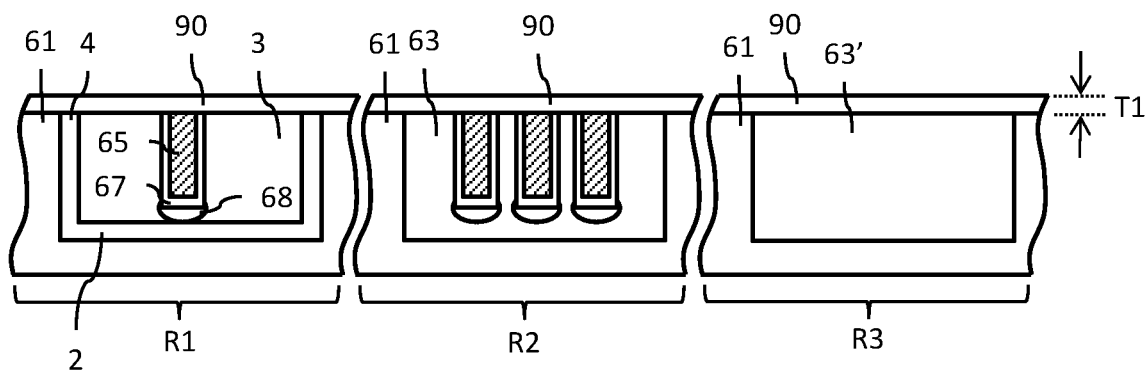
Figure 7E:
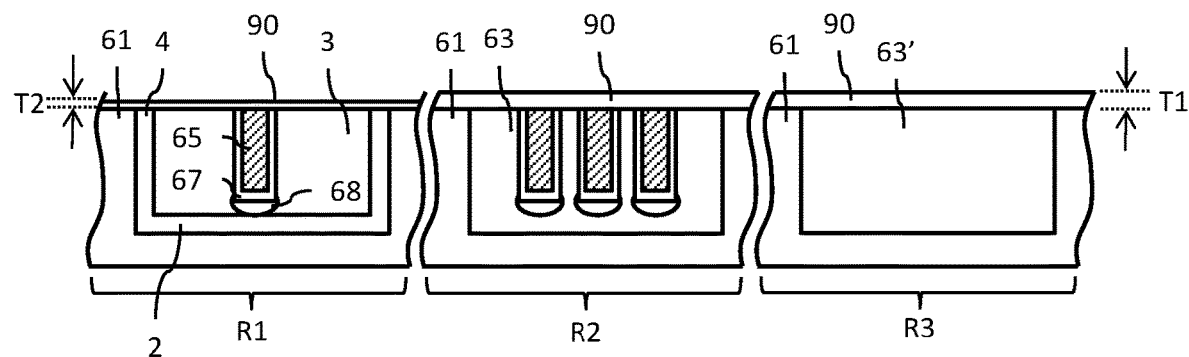
Figure 7F:
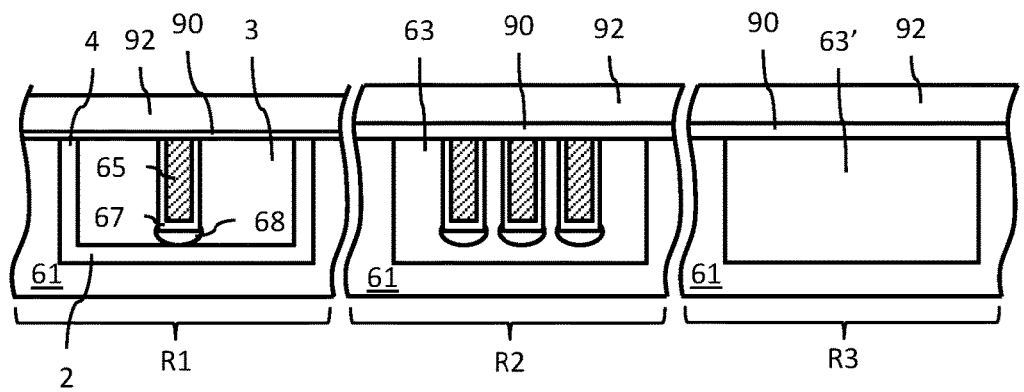
Figure 7G:
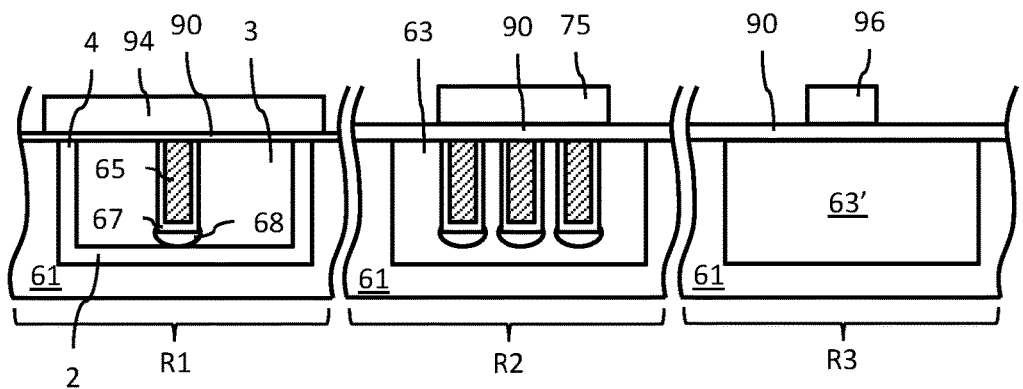
Figure 7H:
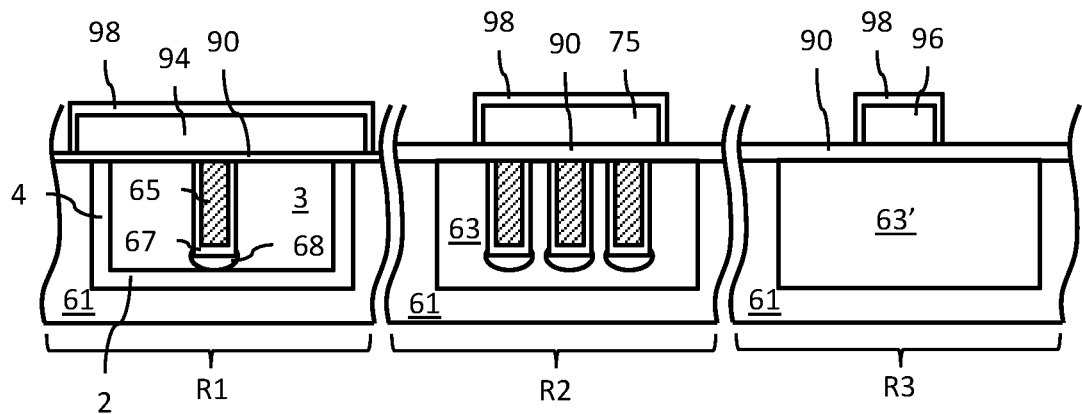
Figure 7I:
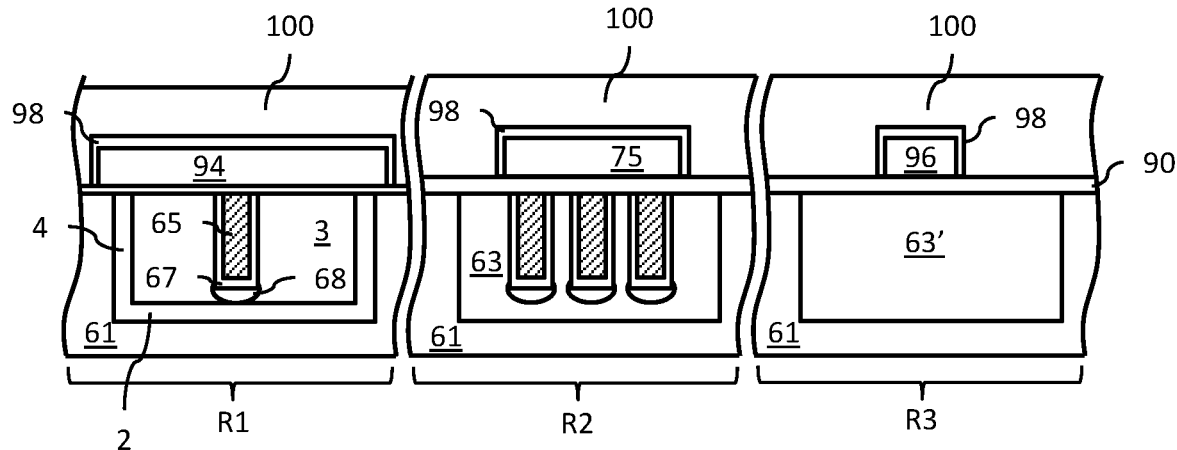
Figure 7J:
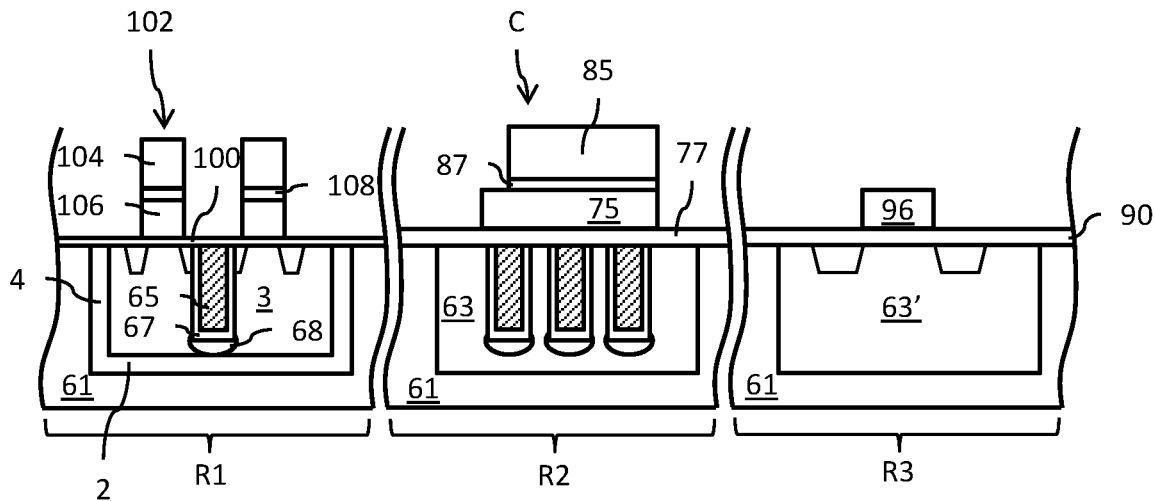

The foregoing structures are shown, for example, in FIGS. 4J and 7J. FIGS. 3B and 6B shows the equivalent schematic for the illustrated memory cell structure.

Reference is now made to FIGS. 4A-4J which illustrates steps of a fabrication process for co-integrating the capacitive element C, the memory cell and the high voltage MOS transistor on a common substrate 1. The common substrate 1 is doped with a first conductivity type (for example, p-type) and divided into a plurality of regions R1, R2, R3 where certain integrated circuit devices are to be fabricated. The region R1 will include memory cells, the region R2 will include capacitive elements, and the region R3 will include high voltage MOS transistors. The regions R1, R2, R3 may be isolated from each other as needed, for example through the use of trench isolation structures (not explicitly shown) as well-known in the art.

In FIG. 4A, the regions R1 and R2 are processed to define the active region for placement of the memory cells and capacitive elements. This process step would include implanting the buried layer 2 and contact regions 4 doped with a second conductivity type (for example, n-type) which delimit the well 3 which is implanted and doped with the first conductivity type. The dotted line in region R2 illustrates that the use of the buried layer 2 and contact regions 4 is optional for delimiting the well 3 for the capacitive elements (i.e., the buried layer 2 and contact regions 4 are present when using the structure shown in FIG. 1 and not present when using the structure shown in FIG. 2).

In FIG. 4B, the region R3 is processed to define the active region for placement of the high voltage MOS transistors. This process step would include implanting a well 3' which is doped with the second conductivity type.

There is no particular order implied by FIGS. 4A and 4B. In more detail, as an example, the process steps in one order would include: a) implanting the buried layer 2 in region R1 and possibly also in region R2; b) implanting the well 3' in region R3; c) implanting the well 3 in regions R1 and R2; and d) implanting the contact regions 4 in region R1 and possibly also in region R2.

In a next step, as shown in FIG. 4C, first trenches TR1 are defined in region R1 and second trenches TR2 are defined in region R2. The trenches TR1 in region R1 form the vertical gate for the access transistor of the memory cell. The trenches TR2 in region R2 form a portion of the vertically structured capacitive element C. The trenches TR1, TR2 in regions R1 and R2, respectively, are formed at the same time and preferably have a same, or substantially identical, depth and are each filled by a central section 5 made of a conductive material that is isolated from the well 3 by an insulating layer 7. Each trench TR1, TR2 may include an implanted region 8 in the well 3 that is doped with the second conductivity type and located at the bottom of the trench. The region R3 is masked off while the trenches TR1, TR2 are formed.

Next, an oxidation process is performed (for example, a thermal oxidation) to form an oxide layer 40 on the front surface 10 of the substrate 1. The result is shown in FIG. 4D. The oxide layer 40 is a common oxide layer extending over the top surface of the substrate 1 having a thickness T1 that is selected for forming the gate oxide of the high voltage MOS transistor being fabricated in region R3 as well as the first insulating layer 17 of the capacitive element C being fabricated in region R2. The thickness T1 may, for example, be in the range of 80-120 Å, and more specifically about 90 Å. Thickness T1 is selected such that the portions of the common oxide layer 40 in regions R2 and R3 support high voltage operation of the capacitive element C and the high voltage MOS transistor.

The thickness T1, however, is too thick for use as the tunnel gate oxide for the floating gate transistor of the memory cell being fabricated in region R1. The regions R2 and R3 are masked off and an etch is performed in region R1 to thin a portion of the common oxide layer 40 to a thickness T2 which is less than the thickness T1. The thickness T2 is selected to support proper operation of the floating gate transistor. The result is shown in FIG. 4E.

A layer 42 of doped polysilicon is then deposited on top of the oxide layer 40. The result is shown in FIG. 4F. The layer 42 of polysilicon may, for example, have a thickness in the range of 900-1400 Å, and more specifically about 1200 Å.

Next, the layer 42 of polysilicon is patterned using conventional lithographic processing techniques to define a layer 44 in the first region R1 which will eventually provide the floating gate electrode of the floating gate transistor for the memory cell, the first conductive layer 15 in the region R2 for the capacitive element C, and the gate electrode 46 in the region R3 for the high voltage MOS transistor. The result is shown in FIG. 4G.

A conformal deposit of a layer 48 of an insulating material, for example, a silicon oxide-nitride-oxide (ONO) dielectric material, is made to cover the layer 44 in the first region R1, the first conductive layer 15 in the region R2 and gate electrode 46 in the region R3. The result is shown in FIG. 4H.

A layer 50 of doped polysilicon is then deposited on top of the ONO layer 48 and oxide layer 40. The result is shown in FIG. 4I. The layer 50 of polysilicon may, for example, have a thickness of about 1200 Å.

Next, the layers 50, 48 and 44 are patterned using conventional lithographic processing techniques to remove the layers 50 and 48 from the region R3, form the gate stack 52 in the first region R1 to include the control gate electrode 54 and floating gate electrode 56 of the floating gate transistor for the memory cell, and form the second conductive layer 25 in the region R3 for the capacitive element C. The result is shown in FIG. 4J. The portion of the layer 48 in region R1 which remains after the patterning provides the dielectric insulator 58 between the control gate electrode 54 and floating gate electrode 56. The portion of the layer 48 in region R2 which remains after the patterning provides the second insulating layer 27 of the capacitive element C. The layer 40 provides the gate oxide between the floating gate electrode 56 and well 3 for the memory cell in region R1. The layer 40 further provides the insulator between the first conductive layer 15 for the capacitive element C and well 3 in the region R2 and provides the gate oxide between the gate electrode 46 and well 3' for the high voltage MOS transistor in region R3.

The use of an oxide layer with the thickness T1 in regions R2 and R3, as compared to the thickness T2 in the region R1, addresses concerns with respect to oxide breakdown between the layer 42 of polysilicon (providing first conductive layer 15 and gate electrode 46) and the substrate 1 and thus permits higher voltage operation of both the capacitive element C and the high voltage MOS transistor.

Further process steps for associated with defining source (S)/drain (D) regions and producing electrical contacts and interconnections are then performed to complete production of the integrated circuit. These further process steps are well-known to those skilled in the art, and thus are neither described in detail nor illustrated in the drawings.

Figure 5:
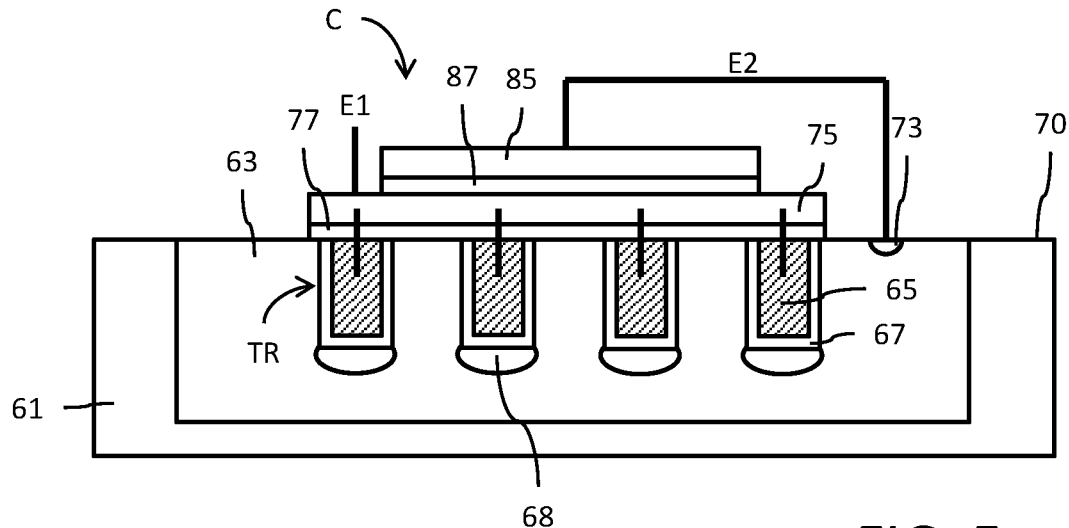
FIG. 5 schematically illustrates another embodiment of a capacitive element.

Reference is now made to FIG. 5 which schematically illustrates another embodiment of a capacitive element C. The capacitive element C is formed in and on a semiconductor substrate 61 doped with a first conductivity type (for example, p-type). A well 63 doped with a second conductivity type (for example, n-type) is formed in the substrate 61. The well 63 further includes trenches TR that extend into the well from a front side 70 of the substrate 61. Each trench TR may include an implanted region 68 in the well 63 that is doped with the second conductivity type and located at and below the bottom of the trench. The trench TR is filled by a central section 65 made of a conductive material that is isolated from the well 63 by an insulating layer 67. For example, the central section 65 may be made of polycrystalline silicon (polysilicon) and the insulating layer 67 may be made of silicon oxide or another suitable dielectric material. On the front side 70, and above the well 63, a stack is formed comprising a first insulating layer 77, a first conductive layer 75, a second insulating layer 87 and a second conductive layer 85. The first and second conductive layers 75 and 85 may, for example, be made of doped polysilicon. The first insulating layer 77 may, for example, be made of a dielectric material such as silicon oxide. The second insulating layer 87 may, for example, be made of a silicon oxide-nitride-oxide (ONO) dielectric material.

A first electrode E1 of the capacitive element C is formed by the conductive central sections 65 of each trench TR which are electrically connected to the first conductive layer 75 using vias and/or metal connection tracks. A second electrode E2 of the capacitive element C is formed by the second conductive layer 85 which is electrically connected to the well 63 using vias and/or metal connection tracks.

Contact-redistribution regions 73 that are highly doped with the first conductivity type allow a contact of acceptable resistivity to be formed between the well 63 and, for example, contacts/metal connection tracks connected to the second conductive layer 85 for the second electrode E2.

The trenches TR extend longitudinally in a direction perpendicular to the cross-sectional plane shown in FIG. 5. With this extension, the trenches TR may extend past the extent of the first insulating layer 77 so as to permit the making of the electrical connection of the conductive central sections 65 of each trench TR to the first conductive layer 75.

Figure 6A:
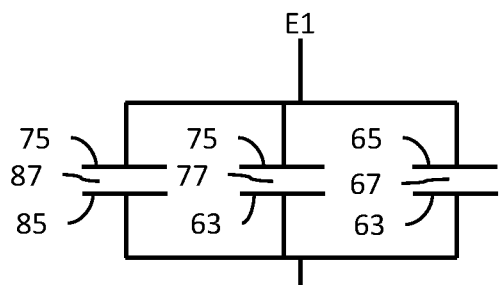
FIG. 6A shows an equivalent circuit diagram for the capacitive element of FIG. 5.

FIG. 6 shows an equivalent circuit diagram for the capacitive element C.

The capacitive element C may be decomposed into an assembly of three capacitive elements in parallel.

A first capacitive element is formed by the first conductive layer 75 and the second conductive layer 85 mutually separated by the second insulating layer 87.

A second capacitive element is formed by the first conductive layer 75 and the well 63 mutually separated by the first insulating layer 77.

A third capacitive element is formed by the central sections 65 of the trenches TR and the well 63 mutually separated by the respective insulating liner 67 of the trenches TR.

The structures for the capacitive element C shown in FIG. 5 are advantageously similar to a structure of a non-volatile memory cell. Specifically, a memory cell may include an access transistor having a vertical gate with a structure homologous to the trenches TR, and a floating-gate transistor with a structure homologous to the stack of the first and second insulating layers 77, 87 and of the first and second conductive layers 75, 85. Still further, the stack of the first insulating layer 77 and the first conductive layer 75 for the capacitive element C shown in FIG. 5 are advantageously similar to a structure of the insulated gate for a high voltage MOS transistor. Because of these similarities, the same fabrication steps can be used in making both the capacitive element C, the memory cell and the high voltage MOS transistor on a common substrate 61.

Reference is now made to FIGS. 7A-7J which illustrates steps of a fabrication process for co-integrating the capacitive element C, the memory cell and the high voltage MOS transistor on a common substrate 61. The common substrate 61 is doped with a first conductivity type (for example, p-type) and divided into a plurality of regions R1, R2, R3 where certain integrated circuit devices are to be fabricated. The region R1 will include memory cells, the region R2 will include capacitive elements, and the region R3 will include high voltage MOS transistors. The regions R1, R2, R3 may be isolated from each other as needed, for example through the use of trench isolation structures (not explicitly shown) as well-known in the art.

In FIG. 7A, the region R1 is processed by implanting the buried layer 2 doped with the second conductivity type and the regions R2 and R3 are processed to define the active region for placement of the capacitive elements and MOS transistors by implanting wells 63 and 63' which are doped with the second conductivity type. In FIG. 7B, the region R1 is further processed to define the active region for placement of the memory cells by implanting the contact regions 4 doped with the second conductivity type and a well 3 which is doped with the first conductivity type.

There is no particular order implied by FIGS. 7A and 7B. In more detail, as an example, the process steps in one order would include: a) implanting the buried layer 2 in region R1; b) implanting the wells 63 and 63' in regions R2 and R3, respectively; c) implanting the well 3 in region R1; and d) implanting the contact regions 4 in region R1.

In a next step, as shown in FIG. 7C, first trenches TR1 are defined in region R1 and second trenches TR2 are formed in region R2. The trenches TR1 in region R1 form the vertical gate for the access transistor of the memory cell. The trenches TR2 in region R2 form a portion of the vertically structured capacitive element C. The trenches TR1, TR2 in regions R1 and R2, respectively, are formed at the same time and preferably have a same, or substantially identical, depth and are filled by a central section 65 made of a conductive material that is isolated from the well 63 by an insulating layer 67. Each trench TR1, TR2 may include an implanted region 68 in the well 63 that is doped with the second conductivity type and located at the bottom of the trench. The region R3 is masked off while the trenches TR1, TR2 are formed.

Next, an oxidation process is performed (for example, a thermal oxidation) to form an oxide layer 90 on the front surface 70 of the substrate 61. The result is shown in FIG. 7D. The oxide layer 90 is a common oxide layer extending over the top surface of the substrate 61 having a thickness T1 that is selected for forming the gate oxide of the high voltage MOS transistor being fabricated in region R3 as well as the first insulating layer 77 of the capacitive element C being fabricated in region R2. The thickness T1 may, for example, be in the range of 80-120 Å, and more specifically about 90 Å. Thickness T1 is selected such that the portions of the common oxide layer 90 in regions R2 and R3 support high voltage operation of the capacitive element C and the high voltage MOS transistor.

The thickness T1, however, is too thick for use as the tunnel gate oxide for the floating gate transistor of the memory cell being fabricated in regions R1. The regions R2 and R3 are masked off and an etch is performed to thin a portion of the common oxide layer 90 in region R1 to a thickness T2 which is less than the thickness T1. The thickness T2 is selected for forming the tunnel gate oxide for the floating gate transistor. The result is shown in FIG. 7E.

A layer 92 of polysilicon is then deposited on top of the oxide layer 90. The result is shown in FIG. 7F. The layer 92 of polysilicon may, for example, have a thickness of about 1200 Å.

Next, the layer 92 of polysilicon is patterned using conventional lithographic processing techniques to define a layer 94 in the first region R1 which will eventually provide the floating gate electrode of the floating gate transistor for the memory cell, the first conductive layer 75 in the region R3 for the capacitive element C, and the gate electrode 96 in the region R3 for the high voltage MOS transistor. The result is shown in FIG. 7G.

A conformal deposit of a layer 98 of an insulating material, for example, a silicon oxide-nitride-oxide (ONO) dielectric material, is made to cover the layer 94 in the first region R1, the first conductive layer 75 in the region R3 and gate electrode 96 in the region R3. The result is shown in FIG. 7H.

A layer 100 of polysilicon is then deposited on top of the ONO layer 98 and oxide layer 90. The result is shown in FIG. 7I. The layer 100 of polysilicon may, for example, have a thickness of about 800 Å.

Next, the layers 100, 98 and 94 are patterned using conventional lithographic processing techniques to remove the layers 100 and 98 from the region R3, form the gate stack 102 in the first region R1 to include the control gate electrode 104 and floating gate electrode 106 of the floating gate transistor for the memory cell, and form the second conductive layer 85 in the region R3 for the capacitive element C. The result is shown in FIG. 7J. The portion of the layer 98 in region R1 which remains after the patterning provides the dielectric insulator 108 between the control gate electrode 104 and floating gate electrode 106. The portion of the layer 98 in region R2 which remains after the patterning provides the second insulating layer 87 of the capacitive element C. The layer 90 provides the gate oxide between the floating gate electrode 106 and well 63 for the memory cell in region R1. The layer 90 further provides the insulator between the first conductive layer 75 and well 63 for the capacitive element C in the region R2 and provides the gate oxide between the gate electrode 96 and well 63' for the high voltage MOS transistor in region R3.

The use of an oxide layer with the thickness T1 in regions R2 and R3, as compared to the thickness T2 in the region R1, addresses concerns with respect to oxide breakdown between the layer 92 of polysilicon and the substrate 61 and thus permits higher voltage operation of both the capacitive element C and the high voltage MOS transistor.

Further process steps for associated with defining source (S)/drain (D) regions and producing electrical interconnections are then performed to complete production of the integrated circuit. These further process steps are well-known to those skilled in the art, and thus are neither described in detail nor illustrated in the drawings.

The invention is not limited to these embodiments and implementations but encompasses any variant thereof; for example, the steps of fabricating the capacitive element C may be implemented separately from said conventional steps of fabricating a memory cell, i.e. implemented in a way dedicated to the fabrication of the capacitive element C; likewise, the first and second conductivity types may be, as shown in the figures, p-type and n-type, respectively, or inversely may be n-type and p-type, respectively.

The invention claimed is:

1. A method, comprising:
   forming a first well and a second well in a semiconductor substrate;
   forming a first trench in the first well and a second trench in the second well, wherein each of the first and second trenches extends vertically and includes a central conductor insulated by a first insulating layer;
   forming a second insulating layer having a first thickness on a top surface of the semiconductor substrate;
   thinning the second insulating layer in an area over the second trench to a second thickness that is less than the first thickness;
   depositing a first polysilicon layer on the second insulating layer;
   lithographically patterning the first polysilicon layer to form:
      a first polysilicon portion separated from the first well by the first thickness of the second insulating layer, said first polysilicon portion being electrically connected to the central conductor of the first trench to form a first plate of a capacitor, a second plate of the capacitor formed by the first well; and
      a second polysilicon portion separated from the second well by the second thickness of the second insulating layer, said second polysilicon portion forming a floating gate electrode of a floating gate transistor of a memory cell having an access transistor whose control gate is formed by the central conductor of the second trench.

2. The method of claim 1, further comprising forming a third well in the semiconductor substrate, and wherein lithographically patterning the first polysilicon layer further forms:
   a third polysilicon portion over the third well, said third polysilicon portion forming a gate electrode of a MOS transistor separated from the third well by the second insulating layer.

3. The method of claim 2, wherein the MOS transistor is a high voltage MOS transistor configured for operation over a high voltage range of 6-12 volts.

4. The method of claim 2, wherein forming the second and third wells comprises doping the second and third wells with a same conductivity type and wherein forming the first well comprises doping the first well with an opposite conductivity type.

5. The method of claim 1, wherein forming the second well comprises insulating the second well from the semiconductor substrate in a triple-well architecture.

6. The method of claim 5, wherein forming the first well comprises insulating the first well from the semiconductor substrate in the triple-well architecture.

7. The method of claim 1, wherein forming the first and second wells comprises doping the first and second wells with a same conductivity type.

8. The method of claim 1, wherein forming the second insulating layer comprises oxidizing the top surface of the substrate.

9. The method of claim 1, further comprising forming a doped region below each of the first and second trenches, the doped region below the second trench forming a source region of the access transistor of the memory cell.

10. The method of claim 1, further comprising:
   depositing a second polysilicon layer insulated from the first polysilicon layer; and
   lithographically patterning the second polysilicon layer to form:
      a third polysilicon portion extending over the first polysilicon portion, said third polysilicon portion being electrically connected to first well to form the second plate of the capacitor; and a fourth polysilicon portion extending over the second polysilicon portion, said fourth polysilicon portion forming a control gate electrode of the floating gate transistor of the memory cell.

11. The method of claim 1, wherein the first thickness is in a range of 80-120 Å.

12. The method of claim 11, wherein first polysilicon layer has a thickness in a range of 900-1400 Å.

13. A method, comprising:
forming a first well and a second well in a semiconductor substrate;
forming a first trench extending vertically into said first well and a second trench extending vertically into said second well;
forming an insulating cladding on sides and a bottom of said first and second trenches;
forming a conductive material in a central section of said first and second trenches;
forming a first insulating layer on a top side of the semiconductor substrate;
selectively thinning the first insulating layer in an area over the second well;
forming a first conductive layer covering the first insulating layer;
lithographically patterning the first conductive layer to form a first conductive portion over the first well and a second conductive portion over the second well;
forming a second conductive layer covering and insulated from the first and second conductive portions;
lithographically patterning the second conductive layer and the second conductive portion to form a third conductive portion over the first well and form a control gate electrode and floating gate electrode over the second well for a floating gate transistor of a memory cell;
wherein the central section in the second trench forms a control gate electrode for an access transistor of the memory cell;

electrically coupling the central section in the first trench to the first conductive portion to form a first electrode of a capacitive element; and
electrically coupling the first well and the third conductive portion to form a second electrode of the capacitive element.

14. The method of claim 13, wherein forming the first well and the second well comprises doping the first and second wells with a same conductivity type.

15. The method of claim 13, wherein forming the first well and the second well comprises doping the first and second wells with opposite conductivity types.

16. The method of claim 13, further comprising forming a third well in the semiconductor substrate, and wherein lithographically patterning the first conductive layer comprises further forming a fourth conductive portion over the third well, said fourth conductive portion providing a gate electrode of a MOS transistor.

17. The method of claim 13, wherein the MOS transistor is a high voltage MOS transistor configured for operation over a high voltage range of 6-12 volts.

18. The method of claim 13, wherein forming the second well comprises insulating the second well from the semiconductor substrate in a triple-well architecture.

19. The method of claim 13, wherein forming the first well comprises insulating the first well from the semiconductor substrate in a triple-well architecture.

20. The method of claim 13, further comprising forming a doped region below each of the first and second trenches, the doped region below the second trench forming a source region of the access transistor of the memory cell.

21. The method of claim 13, wherein the first insulating layer as formed has a first thickness, wherein the first insulating layer in said area where selectively thinned has a second thickness, and wherein the first conductive portion is separated from the first well by the first thickness of the first insulating layer and the second conductive portion is separated from the second well by the second thickness of the first insulating layer.

* * * * *